US007032162B1

(12) United States Patent
Dhamankar

(10) Patent No.: US 7,032,162 B1
(45) Date of Patent: Apr. 18, 2006

(54) POLYNOMIAL EXPANDER FOR GENERATING COEFFICIENTS OF A POLYNOMIAL FROM ROOTS OF THE POLYNOMIAL

(75) Inventor: Sudhind Dhamankar, Santa Clara, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 818 days.

(21) Appl. No.: 10/131,883

(22) Filed: Apr. 25, 2002

(51) Int. Cl.
*H03M 13/00* (2006.01)

(52) U.S. Cl. .................................... 714/784
(58) Field of Classification Search ......... 714/781–786
See application file for complete search history.

(56) References Cited

U.S. PATENT DOCUMENTS

| | | | | |
|---|---|---|---|---|
| 4,845,713 | A | * | 7/1989 | Zook ........................... 714/784 |
| 5,535,140 | A | * | 7/1996 | Iwamura ...................... 701/99 |
| 5,535,225 | A | * | 7/1996 | Mayhew et al. ............ 714/785 |
| 5,787,100 | A | * | 7/1998 | Im ............................. 714/784 |
| 6,061,826 | A | * | 5/2000 | Thirumoorthy et al. ..... 714/784 |
| 6,209,114 | B1 | * | 3/2001 | Wolf et al. .................. 714/784 |
| 6,539,516 | B1 | * | 3/2003 | Cameron .................... 714/785 |

OTHER PUBLICATIONS

Howard M. Shao and Irving S. Reed, *On the VLSI Design of a Pipeline Reed-Solomon Decoder using Systolic Arrays*, IEEE Transactions on Computers, vol. 37, No. 10, Oct. 1988, pp. 1273-1280.

* cited by examiner

*Primary Examiner*—Shelly Chase

(57) ABSTRACT

For generating coefficients of an expanded polynomial, n-roots, each respective coefficient is generated at a respective one of (n+1) coefficient storage registers at one of a first place at a right most place to a (n+1) place at a left most place. In addition, a temporary coefficient is stored as the respective coefficient that was at the first place in a prior clock cycle. Such coefficients are initialized, and then an $i^{th}$ order multiplier output is generated by multiplying an $i^{th}$ order root with the respective coefficient at the first place, and an $i^{th}$ order adder output is generated by adding the temporary coefficient to the $i^{th}$ order multiplier output. The respective coefficients at and to the right of an (i+1) place are shifted toward the right with the respective coefficient at the first place becoming the temporary coefficient. The $i^{th}$ order adder output then becomes the respective coefficient at the (i+1) place. Such a process is performed an (i+1) times for the $i^{th}$ order root with (i+1) clock cycles and for each of the n-roots, for i=1 to n, to generate the respective coefficients of the expanded polynomial.

41 Claims, 5 Drawing Sheets

| Clock Cycle | Coefficient Register #4 Output | Coefficient Register #3 Output | Coefficient Register #2 Output | Coefficient Register #1 Output | Temporary Register Output |
|---|---|---|---|---|---|
| 0 | 0 | 0 | 0 | 1 | 0 |
| 1 | 0 | 0 | a | 0 | 1 |
| 2 | 0 | 0 | 1 | a | 0 |
| 3 | 0 | ab | 0 | 1 | a |
| 4 | 0 | a + b | ab | 0 | 1 |
| 5 | 0 | 1 | a + b | ab | 0 |
| 6 | abc | 0 | 1 | a + b | ab |
| 7 | (a + b)c + ab | abc | 0 | 1 | a + b |
| 8 | a + b + c | ac + bc + ab | abc | 0 | 1 |
| 9 | 1 | a + b + c | ac + bc + ab | abc | 0 |

US 7,032,162 B1

POLYNOMIAL EXPANDER FOR GENERATING COEFFICIENTS OF A POLYNOMIAL FROM ROOTS OF THE POLYNOMIAL

TECHNICAL FIELD

This invention relates generally to error detection/connection and, more particularly, to generating a polynomial for use in error detection/correction.

BACKGROUND

In digital communications, Reed-Solomon (RS) encoders and decoders are used for detecting and correcting errors in digital data transmission. In an RS encoder, check bits are added to the data bits being transmitted to create a data block that is comprised of a number of symbols. Each symbol is comprised of a predetermined number of bits, and each block is comprised of a predetermined number of symbols. An RS decoder, upon receiving a data block, examines the symbols to determine if there are any errors within the data bits and, if so, corrects those errors.

RS decoders use polynomials in the error detection and correction process. FIG. 1 shows a typical structural relationship between an RS decoder 102 and a polynomial expander 104. The RS decoder extracts n roots of an erasure polynomial from a received data block and provides the roots to the expander 104. With these roots, the expander generates an $n^{th}$ order erasure polynomial with coefficients $k_0, k_1, \ldots, k_{n-1}, k_n$ that may be expressed as follows:

$$k_n X^n + k_{n-1} X^{n-1} + \ldots k_1 X + k_0$$

The expander 104 then provides these coefficients to the decoder 102 for detecting and correcting errors in the received data bits.

FIG. 2 shows a common implementation of the polynomial expander 104, in this instance for generating a third order polynomial. A data storage device 106 stores three roots a, b, and c received from RS decoder 102, each of the roots being expressed as a symbol within the received data block. Within the expander 104, a number of coefficient generators 108–114 generate from these roots respective coefficients for each polynomial term. The result is the following polynomial:

$$X^3 + (a+b+c)X^2 + (ac+bc+ab)X + abc$$

Each of the coefficient generators except generator 108 includes adders and/or multipliers. Generator 110 uses two adders 116 and 118 to generate the coefficient (a+b+c); generator 112 uses adders 120 and 122 and multipliers 124, 126, and 128 to generate the coefficient (ac+bc+ab); and generator 114 employs multipliers 130 and 132 to generate the coefficient (abc).

One disadvantage of present polynomial expander designs such as this is that the number of adders and multipliers required to generate the coefficients increases substantially as the order of the polynomial increases. FIG. 2 shows the expander structure for generating a third order polynomial. However, RS decoders commonly require polynomial expanders for generating up to a 16th order polynomial. The additional adders and multipliers for generating such high order polynomials require significant chip area and power when fabricated in an integrated circuit.

Another disadvantage of such polynomial expander designs is the delay in generating the coefficients. The coefficient generators within the expander 104 cannot begin their tasks until the data storage device 106 has received all of the roots from the RS decoder 102. This in turn delays the RS decoder in its detection and correction of errors in the received data bits.

Thus, a mechanism is desired for generating the coefficients of the $n^{th}$ order polynomial given the n-roots of the polynomial with a minimized number of adders and multipliers, and with minimized delay from start of generation of the roots of the polynomial.

SUMMARY

Accordingly, in a general aspect of the present invention, the coefficients of the $n^{th}$ order polynomial are generated given the n-roots of the polynomial with one adder and one multiplier. In addition, such coefficients may be generated in parallel with generation of the roots as soon a first root is provided for minimized delay for generating the coefficients of the polynomial.

In one example embodiment, in a polynomial expander for generating coefficients of an expanded polynomial of a variable, X, from a predetermined number, n, of the roots of the polynomial, a respective coefficient is generated for each of a $X^{(j-1)}$ term of the polynomial, with j being an integer from 1 to (n+1) using (n+1) coefficient storage registers. Each respective coefficient is generated at a respective one of the coefficient storage registers at one of a first place at a right most place to a (n+1) place at a left most place. In addition, a temporary coefficient is stored within a temporary register as the respective coefficient that was at the first place in a prior clock cycle.

The respective coefficient of the coefficient storage register at the first place is initialized to a unitary value, and the respective coefficient of any coefficient storage register not at the first place is initialized to a null value while the temporary coefficient is initialized to a null value. Each of the predetermined number, n, of the roots of the polynomial are provided serially from a first order to an $n^{th}$ order. An $i^{th}$ order multiplier output is generated at a multiplier by multiplying an $i^{th}$ order root with the respective coefficient at the first place, and an $i^{th}$ order adder output is generated at an adder by adding the temporary coefficient to the $i^{th}$ order multiplier output.

In addition, the respective coefficients of the coefficient storage registers at and to the right of an (i+1) place are shifted within such coefficient storage registers toward the right with the respective coefficient at the first place being shifted to become the temporary coefficient. The $i^{th}$ order adder output is then shifted into the respective coefficient storage register at the (i+1) place.

Generation of the $i^{th}$ order multiplier output and the $i^{th}$ order adder output and shifting of respective coefficients at and to the right of the (i+1) place are performed an (i+1) times for the $i^{th}$ order root with (i+1) clock cycles. In addition, the performance (i+1) times of generating the $i^{th}$ order multiplier output and the $i^{th}$ order adder output and shifting of respective coefficients at and to the right of the (i+1) place for the $i^{th}$ order root is further performed for each of the n-roots, with i=1 to n, to generate the respective coefficient for the $X^{(j-1)}$ term of the polynomial at a $j^{th}$ place with (n+1)n/2 clock cycles, with j being an integer from 1 to (n+1).

In another embodiment of the present invention, generation of the $i^{th}$ order multiplier output and the $i^{th}$ order adder output and shifting of respective outputs of the coefficient storage registers at and to the right of the (i+1) place is started for the i$^{th}$ order root as soon as a first order root is generated. A root that is provided while another root is being processed is stored in root buffer registers for later processing of the stored root.

In this manner, the area occupied by any adder and multiplier is advantageously minimized when the polynomial expander of the present invention is implemented as an integrated circuit since only one adder and one multiplier are used. In addition, processing of the roots for generating the coefficients may be started immediately when the first root is provided, and the processing of the roots may proceed in parallel during generation of the roots. Thus, the polynomial expander of the present invention does not wait until all of the roots are generated to start processing the roots for generating the polynomial coefficients. With such immediate and parallel processing of the roots during generation of the roots, delay in generating the polynomial coefficients is minimized.

The polynomial expander of the present invention may be used to particular advantage for generating an erasure polynomial for a Reed-Solomon decoder with the adder and the multiplier being a Galois field adder and a Galois field multiplier, respectively. However, the polynomial expander of the present invention may be used for any other applications that require an expanded polynomial given the roots of the polynomial.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, and 7 refer to elements having similar structure and function.

DETAILED DESCRIPTION

A polynomial expander of an embodiment of the present invention is described for generating the erasure polynomial from the roots provided by a Reed-Solomon decoder. However, such a polynomial expander may be used for any other applications for generally generating an expanded n$^{th}$ order polynomial given the n-roots, as would be apparent to one of ordinary skill in the art of electronics from the description herein.

Figure 3:
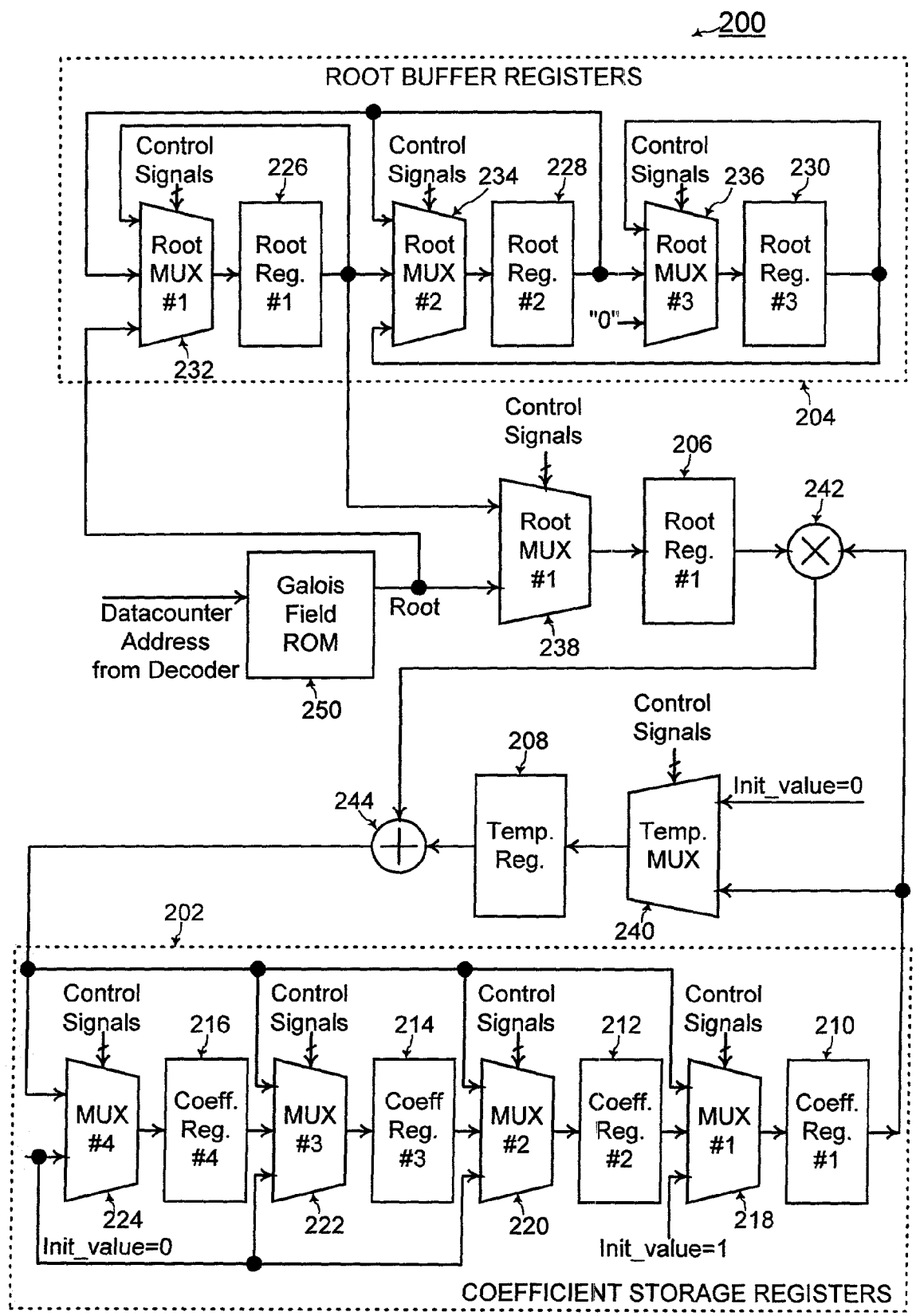
FIG. 3 shows an example block diagram of a polynomial expander using one adder and one multiplier with shifting of intermediary coefficients through coefficient storage registers for immediate and parallel processing of the roots during generation of the roots, according to an embodiment of the present invention.

Referring to FIG. 3, a polynomial expander 200 of an embodiment of the present invention includes a plurality of coefficient storage registers 202 (shown within dashed lines), a plurality of root buffer registers 204 (shown within dashed lines), a root register 206, and a temporary register 208. For generating an n$^{th}$ order polynomial given the n-roots, the plurality of coefficient storage registers 202 includes (n+1) coefficient storage registers. For the example embodiment of the FIG. 3, a third order polynomial is expanded from three roots such that n=3, and (n+1)=4. Thus, the plurality of coefficient storage registers 202 includes a first coefficient storage register 210, a second coefficient storage register 212, a third coefficient storage register 214, and a fourth coefficient storage register 216.

Each of the coefficient storage registers 210, 212, 214, and 216 are coupled in series with each other from a first place which is the right most place to the (n+1) place which is the left most place. (Note that the term "couple" herein means "in signal communication with".) Thus, the first coefficient storage register 210 is at the first place, the second coefficient storage register 212 is at the second place, the third coefficient storage register 214 is at the third place, and the fourth coefficient storage register 216 is at the fourth place.

In addition, each of the coefficient storage registers 210, 212, 214, and 216 has a respective multiplexer for controlling the input and output of a coefficient storage register. The first coefficient storage register 210 has a first multiplexer 218 for controlling the input to (and thus the output of) the first coefficient storage register 210. The second coefficient storage register 212 has a second multiplexer 220 for controlling the input to (and thus the output of) the second coefficient storage register 212. The third coefficient storage register 214 has a third multiplexer 222 for controlling the input to (and thus the output of) the third coefficient storage register 214. The fourth coefficient storage register 216 has a fourth multiplexer 224 for controlling the input to (and thus the output of) the fourth coefficient storage register 216.

In addition, the output terminal of a coefficient storage register is coupled to the input terminal of the coefficient storage register immediately to the right. The output terminal of the fourth coefficient storage register 216 is coupled to the input terminal of the third coefficient storage register 214 through the third multiplexer 222. The output terminal of the third coefficient storage register 214 is coupled to the input terminal of the second coefficient storage register 212 through the second multiplexer 220. The output terminal of the second coefficient storage register 212 is coupled to the input terminal of the first coefficient storage register 210 through the first multiplexer 218.

In addition, in one embodiment of the present invention, the plurality of root buffer registers 204 includes n-root buffer registers for generating the n$^{th}$ order polynomial given the n-roots. For the example embodiment of the FIG. 3 for generating the third order polynomial given the three roots, the plurality of root buffer registers 204 includes a first root buffer register 226, a second root buffer register 228, and a third root buffer register 230.

Each of the root buffer registers 226, 228, and 230 are coupled in series with each other from a first place which is the left most place to the $n^{th}$ place which is the right most place. Thus, the first root buffer register 226 is at the first place, the second root buffer register 228 is at the second place, and the third root buffer register 230 is at the third place. In addition, each of the root buffer registers 226, 228, and 230 has a respective multiplexer for controlling the input and output of a root buffer register. The first root buffer register 226 has a fifth multiplexer 232 for controlling the input to (and this the output of) the first root buffer register 226. The second root buffer register 228 has a sixth multiplexer 234 for controlling the input to (and thus the output of) the second root buffer register 228. The third root buffer register 230 has a seventh multiplexer 236 for controlling the input to (and thus the output of) the third root buffer register 230.

In addition, the output terminal of a root buffer register is coupled to the input terminal of the root buffer register immediately to the right. The output terminal of the first root buffer register 226 is coupled to the input terminal of the second root buffer register 228 through the sixth multiplexer 234. The output terminal of the second root buffer register 228 is coupled to the input terminal of the third root buffer register 230 through the seventh multiplexer 236. Furthermore, the output terminal of a root buffer register is also coupled to the input terminal of the root buffer register immediately to the left. Thus, the output terminal of the third root buffer register 230 is coupled to the input terminal of the second root buffer register 228 through the sixth multiplexer 234. The output terminal of the second root buffer register 228 is coupled to the input terminal of the first root buffer register 226 through the fifth multiplexer 232.

The root register 206 also has an eighth multiplexer 238 for controlling the input to (and thus the output of) the root register 206, and the temporary register 208 has a ninth multiplexer 240 for controlling the input to (and thus the output of) the temporary register 208. The output terminal of the first coefficient storage register 210 is coupled to the input terminal of the temporary register 208 through the ninth multiplexer 240. In addition, the output terminal of the first root buffer register 226 is coupled to the root register 206 through the eighth multiplexer 238.

The polynomial expander 200 further includes a multiplier 242 and an adder 244. The inputs to the multiplier 242 are the output of the first coefficient storage register 210 and the output of the root register 206, and the multiplier 242 multiplies such inputs to generate a multiplier output. The inputs to the adder 244 are the multiplier output from the multiplier 242 and the output of the temporary register 208, and the adder 244 adds such inputs to generate an adder output. The adder output terminal is coupled as an input to each of the multiplexers 218, 220, 222, and 224 of the coefficient storage registers 210, 212, 214, and 216.

In one embodiment of the present invention, when the polynomial expander 200 is used for generating the erasure polynomial with a Reed-Solomon decoder, a Galois field ROM (Read Only Memory) 250 generates each of the n-roots. In that case, the Reed-Solomon decoder 102 provides a respective data-counter address to the Galois field ROM 250 for each root. The Galois field ROM 250 includes a look-up table of the respective root corresponding to each data-counter address provided by the Reed-Solomon decoder 102. Such a Reed-Solomon decoder and Galois field ROM are known to one of ordinary skill in the art of digital communications. The root output from the Galois field ROM 250 is coupled to the root register 206 through the eighth multiplexer 238 and to the first root buffer register 226 through the fifth multiplexer 232.

Furthermore, in the case the polynomial expander 200 is used for generating the erasure polynomial with a Reed-Solomon decoder, each of the registers 206, 208, 210, 212, 214, 216, 226, 228, and 230 are a m-bit data storage device with m being the predetermined number of bits in a symbol of data bits within the block of data bits received by the Reed-Solomon decoder. In addition for that application, the multiplier 242 and the adder 244 are a Galois field multiplier and a Galois field adder, respectively, for performing Galois field arithmetic. Galois field multipliers and Galois field adders for performing Galois field arithmetic in applications for Reed-Solomon decoders are known to one of ordinary skill in the art of digital communications.

Figures 4, 5:
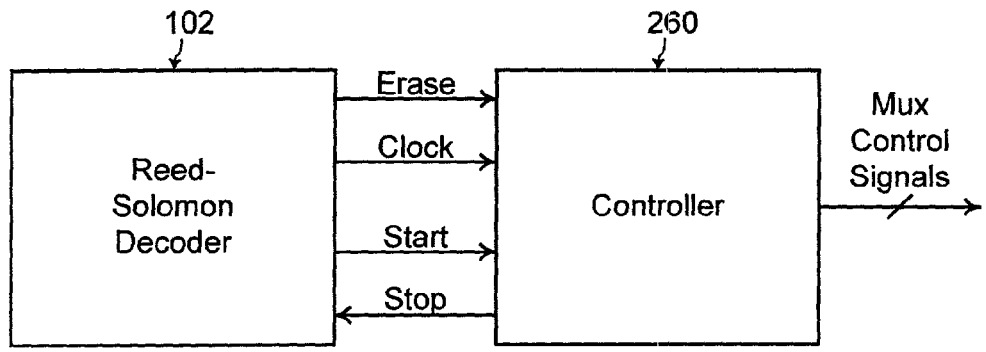
FIG. 4 shows control signals between a Reed-Solomon decoder and a controller for the polynomial expander of FIG. 3, according to an embodiment of the present invention.
FIG. 5 shows a table of intermediary coefficients through the coefficient storage registers during generation of the coefficients of a third order polynomial given the three roots, a, b, and c, according to an embodiment of the present invention.

Each of the multiplexers 218, 220, 222, 224, 232, 234, 236, 238, and 240 determines the input to one of the registers 210, 212, 214, 216, 226, 228, 230, 206, and 240, respectively. Referring to FIG. 4, a controller 260 controls each of the multiplexers 218, 220, 222, 224, 232, 234, 236, 238, and 240 with multiplexer control signals generated from a clock signal and other control signals from the Reed-Solomon decoder 102. The controller 260 controls timing of operation of the polynomial expander 200 of FIG. 3 with the clock signal from the Reed-Solomon decoder.

Figure 6:
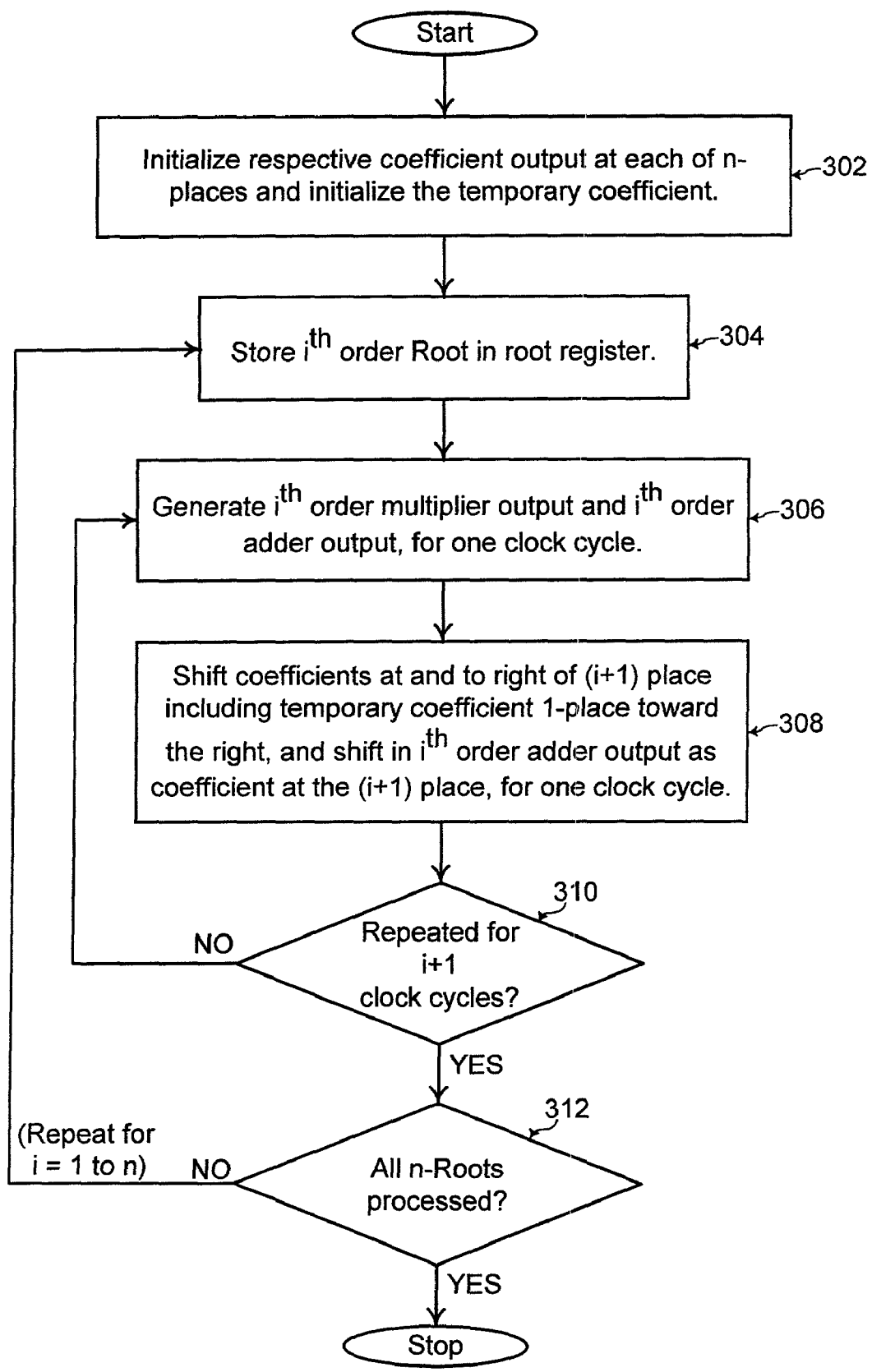
FIG. 6 shows a flowchart of steps of operation of the polynomial expander of FIG. 3 for generating the coefficients of the expanded polynomial given the roots, according to an embodiment of the present invention.

Operation of the polynomial expander 200 of FIG. 3 in conjunction with the controller 260 of FIG. 4 is now described with reference to the table of FIG. 5 and the flow-chart of FIG. 6. FIG. 5 shows a table of intermediary coefficients through the coefficient storage registers 210, 212, 214, and 216 during generation of the coefficients of a third order polynomial given the three roots, a, b, and c, according to an example embodiment of the present invention. FIG. 6 shows a flowchart of steps of operation of the polynomial expander of FIG. 3 for generating the coefficients of the expanded polynomial given the roots, such as during generation of the intermediary coefficients through the coefficient storage registers 210, 212, 214, and 216 as illustrated in the table of FIG. 5, according to an embodiment of the present invention.

Referring to FIGS. 3, 4, 5, and 6, operation begins when the controller 260 receives a start expansion control signal from the Reed-Solomon decoder 102. At that point, the controller 260 generates multiplexer controls signals to initialize the outputs of the coefficient storage registers 210, 212, 214, and 216 and the temporary register 208 (step 302 of FIG. 6). Referring to FIG. 3, the controller 260 controls the second, third, and fourth multiplexers 220, 222, and 224 to select an initial null value "0" to be stored in the second, third, and fourth coefficient storage registers 212, 214, and 216, respectively. The null value "0" is defined as a value that when multiplied with another variable Y, results in the null value "0", and that when added to the other variable Y results in the variable Y. Note that in FIG. 3, the initial null value "0" is coupled as an input to each of the second, third, and fourth multiplexers 220, 222, and 224.

In addition, the controller 260 controls the ninth multiplexer 240 to select the initial null value "0" that is coupled as an input to the ninth multiplexer 240 to be stored in the temporary register 208 during the initialization. Furthermore, the controller 260 controls the first multiplexer 218 to select an initial unitary value "1" that is coupled as an input to the first multiplexer 218 to be stored in the first coefficient storage register 210 during the initialization. The unitary value "1" is defined as a value that when multiplied with another variable Y, results in the variable "Y", and that when added to the other variable Y results in (Y+1). After such initialization, table 5 at the row for clock cycle #0 shows that the respective output of each of the fourth, third, second, and first coefficient storage registers 216, 214, 212, and 210 and the temporary register 240 is "0, 0, 0, 1, 0", respectively.

After the initialization, an $i^{th}$ order root is stored in the root register 206 (step 304 of FIG. 6). Referring to FIG. 4, after the Reed-Solomon decoder 102 provides the start expansion control signal, roots are provided from the Galois field ROM 250. Each time a root is to be provided, the Reed-Solomon decoder 102 generates a respective data-counter address for each root to the Galois Field ROM, and the Reed Solomon decoder 102 asserts the erase control signal to the controller 260. In addition, each of the n-roots are generated from the Galois field ROM 250 serially in order from a first order to an $n^{th}$ order. Thus, each root has an $k^{th}$ order in such a serial order with k being an integer from 1 to n.

Figure 7:
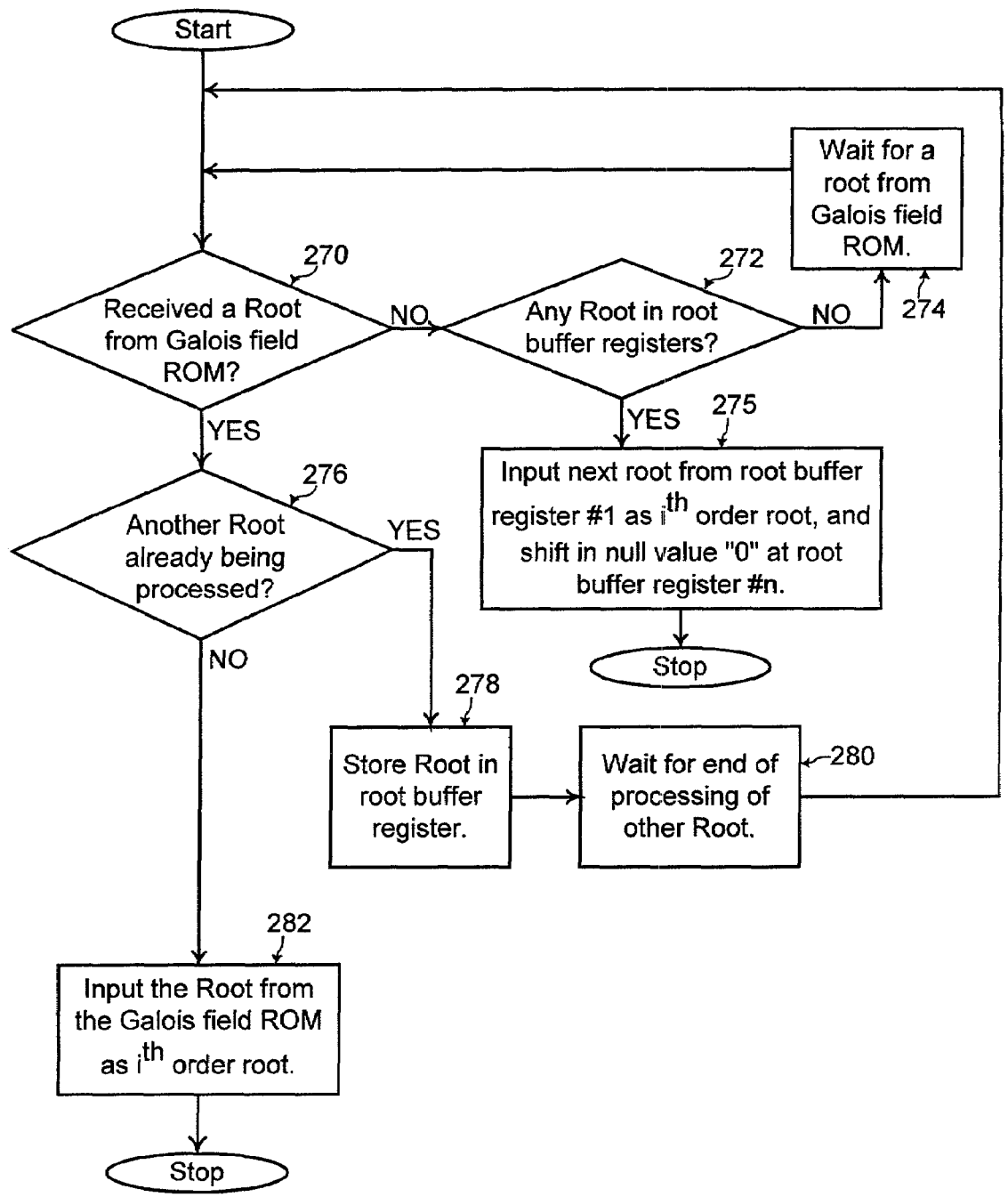
FIG. 7 shows a flowchart of steps of operation of the polynomial expander of FIG. 3 for managing any root that is received while another root is being processed, according to an embodiment of the present invention.

FIG. 7 shows a flow-chart for handling the roots that are generated from the Reed-Solomon decoder 102 and the Galois field ROM 250. Referring to FIG. 7, before any root is generated by the Galois field ROM 250, no root is received from the Galois field ROM 250 (step 270 of FIG. 7) and no roots are stored in the root buffer registers 226, 228, and 230 (step 272 of FIG. 7). In that case, the controller 260 waits for the erase signal from the Reed-Solomon decoder 102 to be asserted for generation of a root from the Galois field ROM 250 (step 274 of FIG. 7).

On the other hand, if no root is currently received from the Galois field ROM 250 but at least one root is stored within the first, second, and third root buffer registers 226, 228, and 230, then the current $i^{th}$ order root to be stored into the root registers 206 is determined to be the output of the first root buffer register 226 (step 275 of FIG. 7). In that case, the controller 260 generates multiplexer control signals to control the eighth multiplexer 238 to select the output of the first root buffer register 226 as the input to be stored within the root register 206. In addition, thereafter, the controller 260 generates multiplexer control signals to control the fifth, sixth, and seventh multiplexers 232, 234, and 236 to shift the outputs of each of the first, second, and third root buffer registers 226, 228, and 230 to the left.

Furthermore, thereafter, the controller 260 generates multiplexer control signals to control the seventh multiplexer 236 to shift the null value "0" into the third root buffer register 230 each time a root from the first root buffer register 226 is stored into the root register 206. Generally, every-time roots are shifted left through the root buffer registers 204 such that the root from the first root buffer register 226 (i.e., the left-most root buffer register) is stored into the root register 206 as the it order root, the controller 260 generates multiplexer control signals to control the right-most multiplexer to shift the null value "0" into the right-most root buffer register.

When a root is generated from the Galois field ROM 250 (step 270 of FIG. 7), then the controller 260 determines whether another root is already being processed through the coefficient storage registers 210, 212, 214, and 216 (step 276 of FIG. 7). If another root is already being processed through the coefficient storage registers 210, 212, 214, and 216, then the root just received from the Galois field ROM 250 is stored into the first root buffer register 226 (step 278 of FIG. 7). In that case, the controller 260 generates multiplexer control signals to control the fifth, sixth, and seventh multiplexers 232, 234, and 236 to first shift the outputs of each of the first, second, and third root buffer registers 226, 228, and 230 to the right and then to store the root just received from the Galois field ROM 250 in the first root buffer register 226. Then, the controller waits for the end of processing of the other root stored in the root register 206 (step 280 in FIG. 7) before returning to step 270 in the flowchart of FIG. 7.

On the other hand, if a root is just received from the Galois field ROM 250 (step 70 of FIG. 7) and if no root is already been processing through the coefficient storage registers 210, 212, 214, and 216 (step 276 of FIG. 7), then the root just received from the Galois field ROM 250 is determined to be the current $i^{th}$ order root to be stored into the root registers 206 (step 282 of FIG. 7). In that case, the controller 260 generates multiplexer control signals to control the eighth multiplexer 238 to select the output of the Galois field ROM 250 as the input to be stored within the root register 206.

In this manner, the first, second, and third root buffer registers 226, 228, and 230 are used for storing any root provided from the Galois field ROM 250 while another root is currently being processing. Such roots are shifted into the first, second, and third root buffer registers 226, 228, and 230 from the left at the first root buffer register 226 (i.e., the left-most root buffer register) to the right toward the third root buffer register 230 (i.e., the right-most root buffer register). In addition, when such stored roots are later processed, the stored roots are shifted from right to left such that the root at the output terminal of the first root buffer register 226 is processed as the $i^{th}$ order root. Thus, the roots stored within the first, second, and third root buffer registers 226, 228, and 230 are processed in a LIFO (last in first out) order.

Figure 1:
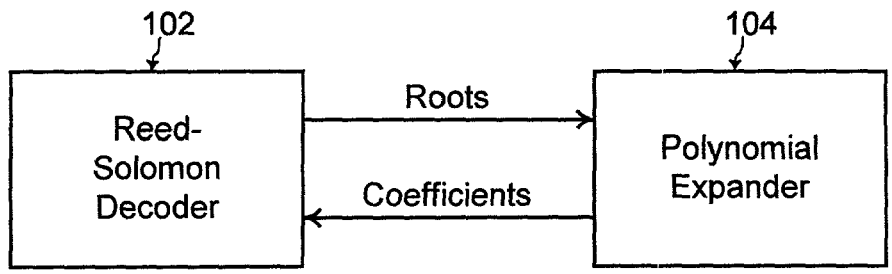
FIG. 1 shows a block diagram of the interaction between a Reed-Solomon decoder and a polynomial expander, as known in the prior art.
Figure 2:
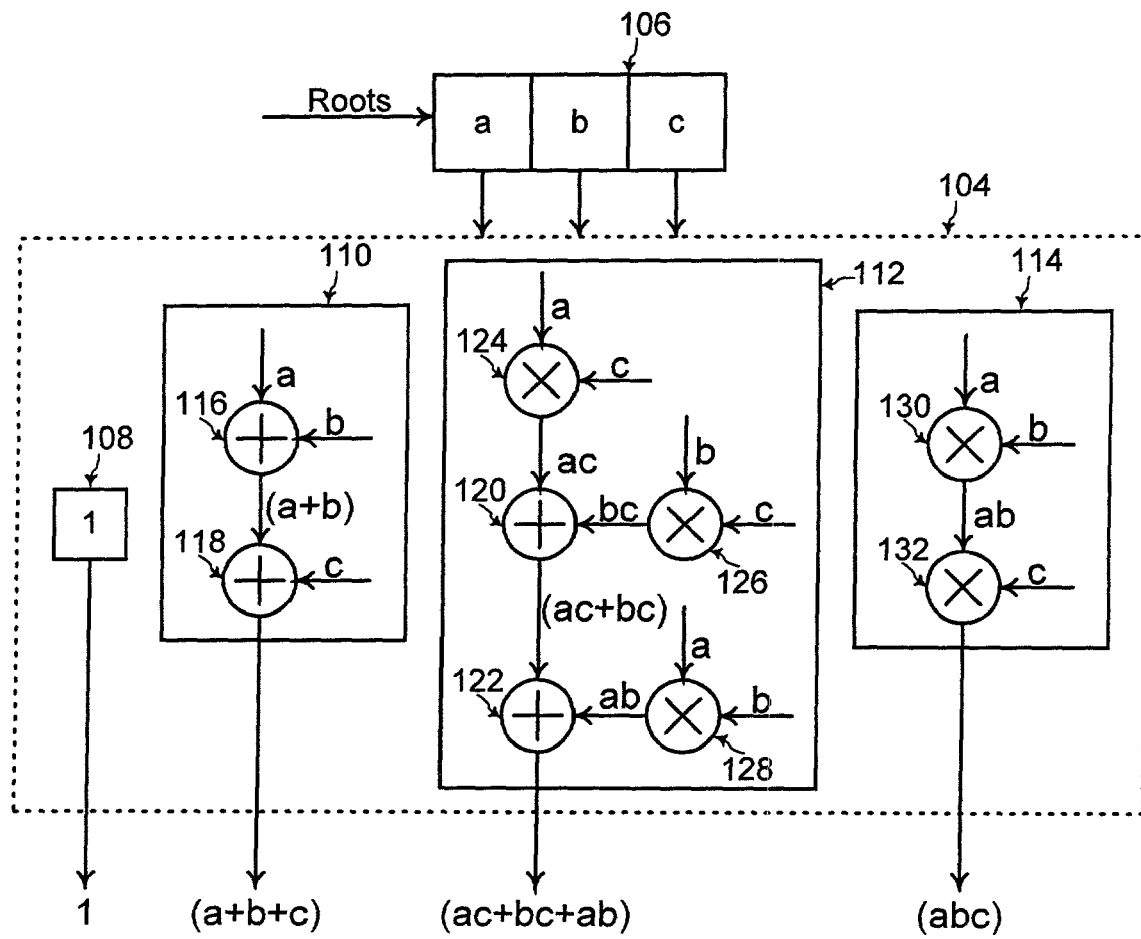
FIG. 2 shows block diagram components of a polynomial expander that generates the coefficients of the polynomial after all of the roots of the polynomial are generated, according to the prior art.

The number of root buffer registers 204 depends on the speed of generation of the roots by the Reed-Solomon decoder and the Galois Field ROM 250 relative to the speed of processing of a root through the coefficient storage registers 202. For example, when the speed of processing of a root through the coefficient storage registers 202 is faster than the speed of generation of the roots by the Reed-Solomon decoder and the Galois Field ROM 250, the number of root buffer registers 204 may be less than "n" since some of the roots may be processed immediately upon generation without being stored into the root buffer registers 204. However, even in the worst-case of all n-roots being stored into the root buffer registers 204, the number of root buffer registers (i.e., "n" in that case) is no worse than the size of the data storage devices 106 for storing all of the n-roots in the prior art (of FIG. 2 for example).

In addition, note that with shifting of the roots toward the right through each of the root buffer registers 204 for storing an additional root and toward the left through each of the root buffer registers 204 for outputting a root to be processed from the left-most root buffer register 226, such an aspect of the present invention keeps track of the stored roots in a simple manner without use of cumbersome pointers and/or address sequencing of the root buffer registers 204. Furthermore, in one embodiment of the present invention, a root is assumed to never be the null value "0". Thus, in that case, the null value "0" is shifted into the right-most root register 230 every-time the roots are shifted toward the left for outputting a root from the left-most root buffer register 226 into the root register 206.

With such a feature, when the null value "0" reaches the first root buffer register 226 (i.e., the left-most root buffer register), all n-roots have been stored within the root buffer registers 204 and have been processed through the coefficient storage registers 202 such that a stop expansion signal may be generated at that point by the controller 260. However, in the case all n-roots are not necessarily stored into the root buffer registers 204, the controller 260 also keeps track of the number of roots processed through the coefficient storage registers 202 to determine when all n-roots have been processed through the coefficient storage registers 202 for generating the stop expansion signal in that case.

In any case, once the current $i^{th}$ order root to be stored into the root registers 206 is determined according to the flowchart of FIG. 7, operation of the polynomial expander 200 of FIG. 3 continues with step 306 of FIG. 6. For the example of generating the third order polynomial with three given roots, a, b, and c in FIG. 3, referring to FIGS. 3, 4, 5, and 6, after initialization after clock cycle #0, the root "a" is generated. Referring to FIG. 7, since another root is not already being processed, the root "a" is determined to be the first order root to be stored in the root register 206.

For this first order root after clock cycle #0, during the first clock cycle #1, the multiplier 242 generates a multiplier output from the root "a" stored in the root register 206 and the unitary value "1" stored in the first coefficient storage register 210 (step 306 of FIG. 6). Thus, the multiplier output from the multiplier 242 after the first clock cycle #1 is "a". In addition, the adder 244 generates an adder output from the multiplier output "a" and the output of the temporary register 208 which is the null value "0" (step 306 of FIG. 6). Thus, the adder output from the adder 244 after the first clock cycle #1 is "a".

Also during the first clock cycle #1, for processing the $i^{th}$ order root "a" with i being "1", the controller 260 generates the multiplexer control signals such that the respective coefficient outputs at and to the right of the (i+1) place, i.e, at the second and first places, are shifted toward the right with the output of the first coefficient storage register 210 being shifted into the temporary register 208 (step 308 of FIG. 6). Such shifting is illustrated by the dashed arrow lines from the first row to the second row in the table of FIG. 5 for clock cycles #0 to #1.

In addition, after such shifting, the controller 260 generates the multiplexer control signals such that the respective coefficient storage register at the (i+1) place stores and outputs the adder output from the adder 244 (step 308 of FIG. 6). For the case of "a" being the first order root such that "i" is "1", the adder output "a" is stored and output by the second coefficient storage register 212. Thus, referring to FIG. 5, after the clock cycle #1, the respective output of each of the fourth, third, second, and first coefficient storage registers 216, 214, 212, and 210 and the temporary register 208 is "0, 0, a, 0, 1", respectively.

Such generation of the multiplier output and the adder output and shifting of the outputs at and to the right of the (i+1) place is performed for a total (i+1) clock cycles (step 310 of FIG. 6). For the example of "a" being the first order root such that "i" is "1", such generation of the multiplier output and the adder output and shifting of the outputs at and to the right of the (i+1) place is performed for a total of two (1+1) clock cycles (i.e., for the first and second clock cycles #1 and #2).

Thus, referring to FIGS. 3 and 5, during the second clock cycle #2, the multiplier 242 generates the multiplier output from the root "a" stored in the root register 206 and the null value "0" stored in the first coefficient storage register 210 (step 306 of FIG. 6). Thus, the multiplier output from the multiplier 242 after the second clock cycle #2 is "0". In addition, the adder 244 generates an adder output from the multiplier output "0" and the output of the temporary register 208 which is the unitary value "1" (step 306 of FIG. 6). Thus, the adder output from the adder 244 after the second clock cycle #2 is "1".

Also during the second clock cycle #2, the controller 260 generates the multiplexer control signals such that the respective coefficient outputs at the second and first places are shifted toward the right with the output of the first coefficient storage register 210 being shifted into the temporary register 208 (step 308 of FIG. 6). Such shifting is illustrated by the dashed arrow lines from the second row to the third row in the table of FIG. 5 for clock cycles #1 to #2. In addition, after such shifting, the controller 260 generates the multiplexer control signals such that the adder output "1" is stored and output by The second coefficient storage register 212. Thus, referring to FIG. 5, after the clock cycle #2, the respective output of each of the fourth, third, second, and first coefficient storage registers 216, 214, 212, and 210 and the temporary register 208 is "0, 0, 1, a, 0", respectively.

For the root "a" being the first order root such that "i" is "1", such a first order root "a" is completely processed through the fourth, third, second, and first coefficient storage registers 216, 214, 212, and 210 after (i+1) clock cycles (i.e., the two clock cycles #1 and #2 in FIG. 5). After complete processing of the $i^{th}$ order root, the controller 260 determines whether all n-roots have been processed through the fourth, third, second, and first coefficient storage registers 216, 214, 212, and 210 (step 312 of FIG. 6). For the example of the third order polynomial from three roots, "a", "b", and "c", all three roots have not yet been processed.

Thus, the controller 260 returns to step 304 to determine another root to be processed according to FIG. 7. If the other roots "b" and/or "c" were generated during processing of root "a", then such roots "b" and/or "c" are stored in the root buffer registers 226 and 228. Or, the other roots "b" and/or "c" may be generated after the root "a" is processed after the clock cycle #2. In any case, assume that root "b" is determined according to FIG. 7 to be the second order root to be stored into the root register 206 to be processed next such that i=2.

Then, referring to FIGS. 3 and 5, during the third clock cycle #3, the multiplier 242 generates the multiplier output from the root "b" stored in the root register 206 and the root "a" stored in the first coefficient storage register 210 (step 306 of FIG. 6). Thus, the multiplier output from the multiplier 242 after the third clock cycle #3 is "ab". In addition, the adder 244 generates an adder output from the multiplier output "ab" and the output of the temporary register 208 which is the null value "0" (step 306 of FIG. 6). Thus, the adder output from the adder 244 after the third clock cycle #3 is "ab".

Also during the third clock cycle #3, the controller 260 generates the multiplexer control signals such that the respective coefficient outputs at the third, second, and first places, are shifted toward the right with the output of the first coefficient storage register 210 being shifted into the temporary register 208 (step 308 of FIG. 6). Such shifting is illustrated by the dashed arrow lines from the third row to the fourth row in the table of FIG. 5 for clock cycles #2 to #3. In addition, after such shifting, the controller 260 generates the multiplexer control signals such that the adder output "ab" is stored and output by the third coefficient storage register 214. Thus, referring to FIG. 5, after the clock cycle #3, the respective output of each of the fourth, third, second, and first coefficient storage registers 216, 214, 212, and 210 and the temporary register 208 is "0, ab, 0, 1, a", respectively.

Such generation of the multiplier output and the adder output and shifting of the outputs at and to the right of the (i+1) place is performed for a total (i+1) clock cycles (step 310 of FIG. 6). For the example of "b" being the second order root such that "i" is "2", such generation of the multiplier output and the adder output and shifting of the outputs at and to the right of the (i+1) place is performed for a total of three (2+1) clock cycles (i.e., for the third, fourth, and fifth clock cycles #3, #4, and #5 in FIG. 5).

During the fourth clock cycle #4, the multiplier 242 generates the multiplier output from the root "b" stored in the root register 206 and the unitary value "1" stored in the first coefficient storage register 210 (step 306 of FIG. 6). Thus, the multiplier output from the multiplier 242 after the fourth clock cycle #4 is "b". In addition, the adder 244 generates an adder output from the multiplier output "b" and the output of the temporary register 208 which is the root "a" (step 306 of FIG. 6). Thus, the adder output from the adder 244 after the fourth clock cycle #4 is "a+b".

Also during the fourth clock cycle #4, the controller 260 generates the multiplexer control signals such that the respective coefficient outputs at the third, second, and first places, are shifted toward the right with the output of the first coefficient storage register 210 being shifted into the temporary register 208 (step 308 of FIG. 6). Such shifting is illustrated by the dashed arrow lines from the fourth row to the fifth row in the table of FIG. 5 for clock cycles #3 to #4. In addition, after such shifting, the controller 260 generates the multiplexer control signals such that the adder output "a+b" is stored and output by the third coefficient storage register 214. Thus, referring to FIG. 5, after the clock cycle #4, the respective output of each of the fourth, third, second, and first coefficient storage registers 216, 214, 212, and 210 and the temporary register 208 is "0, a+b, ab, 0, 1", respectively.

Furthermore, during the fifth clock cycle #5, the multiplier 242 generates the multiplier output from the root "b" stored in the root register 206 and the null value "0" stored in the first coefficient storage register 210 (step 306 of FIG. 6). Thus, the multiplier output from the multiplier 242 after the fifth clock cycle #5 is the null value "0". In addition, the adder 244 generates an adder output from the multiplier output "0" and the output of the temporary register 208 which is the unitary value "1" (step 306 of FIG. 6). Thus, the adder output from the adder 244 after the fifth clock cycle #5 is "1".

Also during the fifth clock cycle #5, the controller 260 generates the multiplexer control signals such that the respective coefficient outputs at the third, second, and first places, are shifted toward the right with the output of the first coefficient storage register 210 being shifted into the temporary register 208 (step 308 of FIG. 6). Such shifting is illustrated by the dashed arrow lines from the fifth row to the sixth row in the table of FIG. 5 for clock cycles #4 to #5. In addition, after such shifting, the controller 260 generates the multiplexer control signals such that the adder output "1" is stored and output by the third coefficient storage register 214. Thus, referring to FIG. 5, after the clock cycle #5, the respective output of each of the fourth, third, second, and first coefficient storage registers 216, 214, 212, and 210 and the temporary register 208 is "0, 1, a+b, ab, 0", respectively.

For the root "b" being the second order root such that "i" is "2", such a second order root "b" is completely processed through the fourth, third, second, and first coefficient storage registers 216, 214, 212, and 210 after (i+1) clock cycles (i.e., the three clock cycles #3, #4, and #5 in FIG. 5). After complete processing of the $i^{th}$ order root, the controller 260 determines whether all n-roots have been processed through the fourth, third, second, and first coefficient storage registers 216, 214, 212, and 210 (step 312 of FIG. 6). For the example of the third order polynomial from three roots, "a", "b", and "c", all three roots have not yet been processed.

The root "c" remains the third order root to be processed for that example. Thus, the controller 260 returns to step 304 to determine according to FIG. 7 that root "c" is the third order root to be stored into the root register 206 and to be processed next with i=3. Then, referring to FIGS. 3 and 5, during the sixth clock cycle #6, the multiplier 242 generates the multiplier output from the root "c" stored in the root register 206 and the value "ab" stored in the first coefficient storage register 210 (step 306 of FIG. 6). Thus, the multiplier output from the multiplier 242 after the sixth clock cycle #6 is "abc". In addition, the adder 244 generates an adder output from the multiplier output "abc" and the output of the temporary register 208 which is the null value "0" (step 306 of FIG. 6). Thus, the adder output from the adder 244 after the sixth clock cycle #6 is "abc".

Also during the sixth clock cycle #6, the controller 260 generates the multiplexer control signals such that the respective coefficient outputs at the fourth, third, second, and first places, are shifted toward the right with the output of the first coefficient storage register 210 being shifted into the temporary register 208 (step 308 of FIG. 6). Such shifting is illustrated by the dashed arrow lines from the sixth row to the seventh row in the table of FIG. 5 for clock cycles #5 to #6. In addition, after such shifting, the controller 260 generates the multiplexer control signals such that the adder output "abc" is stored and output by the fourth coefficient storage register 216. Thus, referring to FIG. 5, after the clock cycle #6, the respective output of each of the fourth, third, second, and first coefficient storage registers 216, 214, 212, and 210 and the temporary register 208 is "abc, 0, 1, a+b, ab", respectively.

Such generation of the multiplier output and the adder output and shifting of the outputs at and to the right of the (i+1) place is performed for a total (i+1) clock cycles (step 310 of FIG. 6). For the example of "c" being the third order root such that "i" is "3", such generation of the multiplier output and the adder output and shifting of the coefficient outputs at and to the right of the (i+1) place is performed for a total of four (3+1) clock cycles (i.e., for the sixth, seventh, eighth, and ninth clock cycles #6, #7, #8, and #9 in FIG. 5).

During the seventh clock cycle #7, the multiplier 242' generates the multiplier output from the root "c" stored in the root register 206 and the value "a+b" stored in the first coefficient storage register 210 (step 306 of FIG. 6). Thus, the multiplier output from the multiplier 242 after the seventh clock cycle #7 is "c(a+b)". In addition, the adder 244 generates an adder output from the multiplier output "c(a+b)" and the output of the temporary register 208 which is "ab" (step 306 of FIG. 6). Thus, the adder output from the adder 244 after the seventh clock cycle #7 is "(a+b)c+ab".

Also during the seventh clock cycle #7, the controller 260 generates the multiplexer control signals such that the respective coefficient outputs at the fourth, third, second, and first places, are shifted toward the right with the output of the first coefficient storage register 210 being shifted into the temporary register 208 (step 308 of FIG. 6). Such shifting is illustrated by the dashed arrow lines from the seventh row to the eighth row in the table of FIG. 5 for clock cycles #6 to #7. In addition, after such shifting, the controller 260 generates the multiplexer control signals such that the adder output "(a+b)c+ab" is stored and output by the fourth coefficient storage register 216. Thus, referring to FIG. 5, after the clock cycle #7, the respective output of each of the fourth, third, second, and first coefficient storage registers 216, 214, 212, and 210 and the temporary register 208 is "(a+b)c+ab, abc, 0, 1, a+b", respectively.

During the eighth clock cycle #8, the multiplier 242 generates the multiplier output from the root "c" stored in the root register 206 and the unitary value "1" stored in the first coefficient storage register 210 (step 306 of FIG. 6). Thus, the multiplier output from the multiplier 242 after the eighth clock cycle #8 is "c". In addition, the adder 244 generates an adder output from the multiplier output "c" and the output of the temporary register 208 which is "a+b" (step 306 of FIG. 6). Thus, the adder output from the adder 244 after the eighth clock cycle #8 is "a+b+c".

Also during the eighth clock cycle #8, the controller 260 generates the multiplexer control signals such that the respective coefficient outputs at the fourth, third, second, and first places, are shifted toward the right with the output of the first coefficient storage register 210 being shifted into the temporary register 208 (step 308 of FIG. 6). Such shifting is illustrated by the dashed arrow lines from the eighth row to the ninth row in the table of FIG. 5 for clock cycles #7 to #8. In addition, after such shifting, the controller 260 generates the multiplexer control signals such that the adder output "a+b+c" is stored and output by the fourth coefficient storage register 216. Thus, referring to FIG. 5, after the clock cycle #8, the respective output of each of the fourth, third, second, and first coefficient storage registers 216, 214, 212, and 210 and the temporary register 208 is "a+b+c, ac+bc+ab, abc, 0, 1", respectively.

During the ninth clock cycle #9, the multiplier 242 generates the multiplier output from the root "c" stored in the root register 206 and the null value "0" stored in the first coefficient storage register 210 (step 306 of FIG. 6). Thus, the multiplier output from the multiplier 242 after the ninth clock cycle #9 is the null value "0". In addition, the adder 244 generates an adder output from the multiplier output "0" and the output of the temporary register 208 which is the unitary value "1" (step 306 of FIG. 6). Thus, the adder output from the adder 244 after the ninth clock cycle #9 is "1".

Also during the ninth clock cycle #9, the controller 260 generates the multiplexer control signals such that the respective coefficient outputs at the fourth, third, second, and first places, are shifted toward the right with the output of the first coefficient storage register 210 being shifted into the temporary register 208 (step 308 of FIG. 6). Such shifting is illustrated by the dashed arrow lines from the ninth row to the tenth row in the table of FIG. 5 for clock cycles #8 to #9. In addition, after such shifting, the controller 260 generates the multiplexer control signals such that the adder output "1" is stored and output by the fourth coefficient storage register 216. Thus, referring to FIG. 5, after the clock cycle #9, the respective output of each of the fourth, third, second, and first coefficient storage registers 216, 214, 212, and 210 and the temporary register 208 is "1, a+b+c, ac+bc+ab, abc, 0", respectively.

For the root "c" being the third order root such that "i" is "3,", such a third order root "c" is completely processed through the fourth, third, second, and first coefficient storage registers 216, 214, 212, and 210 after (i+1) clock cycles (i.e., the four clock cycles #6, #7, #8, and #9 in FIG. 5). After complete processing of the $i^{th}$ order root, the controller 260 determines whether all n-roots have been processed through the fourth, third, second, and first coefficient storage regis ters 216, 214, 212, and 210 (step 312 of FIG. 6). For the example of the third order polynomial from three roots, "a", "b", and "c", all three roots have now been processed.

Thus, the flow-chart of FIG. 6 ends, and the controller 260 in FIG. 4 sends a stop expansion control signal to the Reed-Solomon decoder 102 to indicate that expansion of the $n^{th}$ order polynomial from the n-roots is now complete. At that point, the respective output of each of the first, second, third, and fourth coefficient storage registers 210, 212, 214, and 216 is the respective coefficient of each of the $X^{j-1}$ term of the expanded polynomial with j being an integer from 1 to (n+1), respectively. Thus, for the example of FIGS. 3 and 5, the expanded third order polynomial from the three roots, "a", "b", and "c" is as follows:

$$X^3+(a+b+c)X^2+(ac+bc+ab)X+abc$$

Thus, referring to the example of FIG. 5, the number of clock cycles used for completing the expansion of the $n^{th}$ order polynomial given the n-roots is as follows:

$$2+3+\ldots+(n+1)=(n+1)n/2$$

In this manner, the polynomial expander 200 of the present invention uses only one multiplier 242 and one adder 244. Thus, the area occupied by any adder and multiplier is advantageously minimized when the polynomial expander 200 of the present invention is implemented as an integrated circuit since only one multiplier 242 and one adder 244 are used. In addition, processing of the roots for generating the coefficients may be started immediately when the first root is provided at clock cycle #1 in FIG. 5. Thus, the processing of the roots for expanding the polynomial may proceed in parallel during generation of the roots. As a result, the polynomial expander of the present invention does not wait until all of the roots are generated to start processing the roots for generating the polynomial coefficients. With such immediate and parallel processing of the roots during generation of the roots, delay in generating the polynomial coefficients is minimized.

It will be understood by those of skill in the art that the foregoing description is only exemplary of the invention and is not intended to limit its application to the structure and operation described herein. Any of the components of the polynomial expander 200 and the controller 260 can be implemented in hardware or software, in discrete or integrated circuits, and in fixed or programmable logic devices. Implementation of the controller 260 for generating the multiplexer control signals for controlling the multiplexers as described herein would be known to one of ordinary skill in the art of electronics from the description herein. In addition, the number of coefficient storage registers 202 and the number of root buffer registers 204 may be generalized for expanding any $n^{th}$ order polynomial given n-roots, as would be apparent to one of ordinary skill in the art of electronics from the description herein.

Furthermore, the polynomial expander 200 of FIG. 3 is described for generating the erasure polynomial from the roots provided by a Reed-Solomon decoder. However, such a polynomial expander may be used for generally expanding the $n^{th}$ order polynomial given the n-roots for any other applications with any type of multiplier 242 and any type of adder 244 than for just the example of Galois field arithmetic, as would be apparent to one of ordinary skill in the art of electronics from the description herein.

The present invention is limited only as defined in the following claims and equivalents thereof.

The invention claimed is:

1. A polynomial expander for generating coefficients of an expanded polynomial of a variable, X, from a predetermined number, n, of the roots of the polynomial, the polynomial expander comprising:

(n+1) coefficient storage registers coupled in series from a first place at a right most place to a (n+1) place at a left most place, wherein a respective coefficient storage register at a j-th place generates a respective coefficient for a $X^{(j-1)}$ term of the polynomial, with j being an integer from 1 to (n+1);

a temporary register coupled in series with the coefficient storage register at the first place for storing as a temporary coefficient the respective coefficient that was output by said coefficient storage register at said first place in a prior clock cycle;

a root register for storing a root of said polynomial;

a multiplier having as inputs, an output of said root register and an output of said coefficient storage register at the first place;

an adder having as inputs, an output of said multiplier and an output of said temporary register; and a respective multiplexer coupled to each of said coefficient storage registers, said temporary register, and said root register, and a controller for determining a respective input to each of said coefficient storage registers, said temporary register, and said root register through said respective multiplexer;

wherein said controller controls said respective multiplexers coupled to said coefficient storage registers for initializing the coefficient storage register at the first place to output a unitary value and all other coefficient storage registers not at the first place to output a null value, and wherein said controller controls said respective multiplexer coupled to said temporary register for initializing said temporary register to output a null value as said temporary coefficient;

and wherein each of said predetermined number, n, of the roots of the polynomial are provided serially from a first order to an $n^{th}$ order;

and wherein for an $i^{th}$ order root stored in said root register, the $i^{th}$ order root is multiplied at said multiplier by the output of the coefficient storage register at the first place to generate an $i^{th}$ order multiplier output, and wherein the output of said temporary register is added at said adder to said $i^{th}$ order multiplier output to generate an $i^{th}$ order adder output;

and wherein outputs of the coefficient storage registers at and to the right of an (i+1) place shift toward the right with the output of the coefficient storage register at the first place being shifted into said temporary register, and wherein said $i^{th}$ order adder output is input by the coefficient storage register at said (i+1) place;

and wherein generation, of said $i^{th}$ order multiplier output and said $i^{th}$ order adder output and shifting of respective outputs of the coefficient storage registers at and to the right of said (i+1) place, is performed an (i+1) times for said $i^{th}$ order root with (i+1) clock cycles;

and wherein said performing, said (i+1) times of generating said it order multiplier output and said in order adder output and shifting of respective outputs of the coefficient storage registers at and to the right of said (i+1) place for said $i^{th}$ order root stored in said root register, is further performed for each of said n-roots, for i=1 to n, to generate each of the respective coefficient for the $X^{(j-1)}$ term of the polynomial at the respective coefficient storage register at a j-th place with (n+1)n/2 clock cycles, with j being an integer from 1 to (n+1).

2. The polynomial expander of claim 1, wherein generating said ith order multiplier output and said $i^{th}$ order adder output and shifting of respective outputs of the coefficient storage registers at and to the right of said (i+1) place, starts as soon as a first order root is generated.

3. The polynomial expander of claim 1, further comprising:

at least one root buffer register for storing a root that is provided while another root within said root register is being processed, for later processing said stored root.

4. The polynomial expander of claim 3, further comprising:

n root buffer registers, each root buffer register storing a respective root that is provided while another root within said root register is being processed, for later processing each of said stored root.

5. The polynomial expander of claim 3, wherein said at least one root buffer register is a plurality of root buffer registers that are coupled in series from a left-most root buffer register to a right-most root buffer register, and wherein the respective root stored in each of said root buffer registers is shifted toward the right for storing another root into said left-most root buffer register, and wherein the respective root stored in each of said buffer registers is shifted toward the left for outputting a root from said left-most root buffer as said it root.

6. The polynomial expander of claim 5, wherein a null value "0" is shifted into said right-most root buffer register each time the respective root stored in each of said buffer registers is shifted toward the left for outputting a root from said left-most root buffer such that the null value "0" reaching said left-most root buffer register indicates that all of said n-roots have been processed through said coefficient storage registers.

7. The polynomial expander of claim 1, wherein each of said roots is provided for a Reed-Solomon decoder for generating said polynomial that is an erasure polynomial used for determining corrections within a block of digital data bits received by the Reed-Solomon decoder.

8. The polynomial expander of claim 7, wherein each of said roots is provided from a Galois Field ROM (Read-Only-Memory).

9. The polynomial expander of claim 8, wherein said Reed-Solomon decoder asserts an erase control signal to said controller for indicating that another one of said roots of said polynomial is to be extracted from said Galois Field ROM with a data counter address provided to said Galois Field ROM from said Reed-Solomon decoder.

10. The polynomial expander of claim 8, wherein said multiplier is a Galois Field multiplier, and wherein said adder is a Galois Field adder.

11. The polynomial expander of claim 7, wherein said controller initializes each of said respective outputs of said coefficient storage registers and the output of said temporary register when said Reed-Solomon decoder provides a start expansion control signal to said controller, and wherein said controller provides a stop expansion control signal to said Reed-Solomon decoder when the respective coefficient for each of the $X^{(j-1)}$ term of the polynomial is generated by said coefficient storage registers after processing of each of the n roots.

12. A polynomial expander circuit comprising:

a plurality of coefficient storage registers operable to store polynomial coefficients;

a temporary coefficient register coupled to an output terminal of the coefficient storage registers;

a root register;

a multiplier coupled to the root register and the output terminal of the coefficient storage registers, the multiplier operable to multiply a root value stored in the root register with a value stored in the coefficient storage registers; and an adder coupled to the multiplier and to an output terminal of the temporary coefficient register, the adder operable to sum the multiplier product with a value stored in the temporary coefficient register, the adder further coupled to input terminals of the coefficient storage registers and operable to provide the sum to the coefficient storage registers; and a multiplexer having an output terminal coupled to the input terminal of the temporary coefficient resister, a first input terminal coupled to the output terminal of the coefficient storage registers, and a second input terminal coupled to an initial value source.

13. The polynomial expander of claim 12, wherein the plurality of coefficient storage registers comprises associated pairs of multiplexers and registers coupled in series, each multiplexer having an output terminal coupled to the input terminal of the associated register, a first input terminal coupled to the adder, and a second input terminal coupled to the output terminal of a preceding coefficient storage register.

14. The polynomial expander of claim 13 including a controller coupled to a control terminal of each multiplexer, the controller operable to select through each multiplexer between the adder sum and value of the preceding register as the value to be stored in the associated register.

15. The polynomial expander of claim 13, wherein each multiplexer has a third input terminal coupled to an initial value source.

16. A polynomial expander circuit comprising:

a plurality of coefficient storage registers operable to store polynomial coefficients;

a temporary coefficient register coupled to an output terminal of the coefficient storage registers;

a root register;

a multiplier coupled to the mot register and the output terminal of the coefficient storage registers, the multiplier operable to multiply a root value stored in the root register with a value stored in the coefficient storage resisters; an adder coupled to the multiplier and to an output terminal of the temporary coefficient register, the adder operable to sum the multiplier product with a value stored in the temporary coefficient register, the adder further coupled to input terminals of the coefficient storage registers and operable to provide the sum to the coefficient storage registers;

a root multiplexer; and a root buffer register operable to store a root value while another root value is being processed, the root multiplexer having an output terminal coupled to the input terminal of the root register, a first input terminal coupled to a first source of root values, and a second input terminal coupled to an output terminal of the root buffer register, the root multiplexer operable to select between the first source of root values and the root buffer register as the source of the root value for the root register.

17. The polynomial expander of claim 16 wherein the first source of root values is also coupled to the root buffer register.

18. The polynomial expander of claim 16 wherein the root buffer register is one of a plurality of root buffer registers operable to store roots values while another root value is being processed.

19. The polynomial expander of claim 16 wherein the first source of root values is a look-up table.

20. The polynomial expander of claim 19 wherein the look-up table is coupled to an RS decoder, the look-up table responsive to an address from the decoder to provide an associated root value.

21. A computer-readable medium on which is stored computer instructions for creating in a programmable logic device a polynomial expander circuit comprising:

a plurality of coefficient storage registers operable to store polynomial coefficients;

a temporary coefficient register coupled to an output terminal of the coefficient storage registers;

a root register;

a multiplier coupled to the root register and the output terminal of the coefficient storage registers, the multiplier operable to multiply a root value stored in the root register with a value stored in the coefficient storage registers; an an adder coupled to the multiplier and to an output terminal of the temporary coefficient register, the adder operable to sum the multiplier product with a value stored in the temporary coefficient register, the adder further coupled to input terminals of the coefficient storage registers and operable to provide the sum to the coefficient storage registers; and a multiplexer having an output terminal coupled to the input terminal of the temporary coefficient register, a first input terminal coupled to the output terminal of the coefficient storage registers, and a second input terminal coupled to an initial value source.

22. A method for generating in a circuit coefficients of an expanded polynomial of a variable, X, from a predetermined number, n, of the roots of the polynomial, comprising:

generating a respective coefficient for each of a $X^{(j-1)}$ term of the polynomial, with j being an integer from 1 to (n+1), with each respective coefficient being generated at a respective one of a first place at a right most place to a (n+1) place at a left most place;

storing as a temporary coefficient the respective coefficient that was at said first place in a prior clock cycle;

initializing the respective coefficient at the first place to a unitary value and any other respective coefficient not at the first place to a null value, and initializing the temporary coefficient to a null value;

wherein said predetermined number, n, of the roots of the polynomial are provided serially from a first order to an $n^{th}$ order;

generate an $i^{th}$ order multiplier output by multiplying an $i^{th}$ order root with the respective coefficient at the first place, and generating an $i^{th}$ order adder output by adding the temporary coefficient to said $i^{th}$ order multiplier output;

shifting respective coefficients at and to the right of an (i+1) place toward the right with the respective coefficient at the first place being shifted to become the temporary coefficient, and shifting in said $i^{th}$ order adder output to be the respective coefficient at said (i+1) place;

performing, generation of said $i^{th}$ order multiplier output and said $i^{th}$ order adder output and shifting of respective coefficients at and to the right of said (i+1) place, an (i+1) times for said $i^{th}$ order root with (i+1) clock cycles; and performing, said (i+1) times of generating said it order multiplier output and said $i^{th}$ order adder output and shifting of respective coefficients at and to the right of said (i+1) place for said $i^{th}$ order root, for each of said n-roots, for i=1 to n, to generate the respective coefficient for the $X^{(j-1)}$ term of the polynomial at a j-th place with (n+1)n/2 clock cycles, with j being an integer from 1 to (n+1).

23. The method of claim 22, further comprising:
starting, generation of said $i^{th}$ order multiplier output and said $i^{th}$ order adder output and shifting of respective outputs of the coefficient storage registers at and to the right of said (i+1) place for said $i^{th}$ order root, as soon as a first order root is generated.

24. The method of claim 22, further comprising:
storing a root that is provided while another root is being processed for later processing of said stored root.

25. The method of claim 24, wherein each stored root is stored in a respective one of a plurality of root buffer registers that are coupled in series from a left-most root buffer register to a right-most root buffer, the method further comprising:
shifting the respective root stored in each of said root buffer registers toward the right for storing another root into said left-most root buffer register; and
shifting the respective root stored in each of said buffer registers toward the left for outputting a root from said left-most root buffer as said it root.

26. The method of claim 25, further comprising:
shifting a null value "0" into said right-most root buffer register each time the respective root stored in each of said buffer registers is shifted toward the left for outputting a root from said left-most root buffer such that the null value "0" reaching said left-most root buffer register indicates that all of said n-roots have been processed.

27. The method of claim 22, wherein each of said roots is provided for a Reed-Solomon decoder for generating said polynomial that is an erasure polynomial used for determining corrections within a block of digital data bits received by the Reed-Solomon decoder.

28. The method of claim 27, wherein each of said roots is provided from a Galois Field ROM (Read-Only-Memory).

29. The method of claim 28, wherein said Reed-Solomon decoder asserts an erase control signal for indicating that another one of said roots of said polynomial is to be extracted from said Galois Field ROM with a data counter address provided to said Galois Field ROM from said Reed-Solomon decoder.

30. The method of claim 28, wherein a Galois Field multiplier generates said $i^{th}$ order multiplier output, and wherein a Galois Field adder generates said $i^{th}$ order adder output.

31. The method of claim 27, further comprising:
inputting a start expansion control signal from said Reed-Solomon decoder for initializing each of the respective coefficients and the temporary coefficient; and
outputting a stop expansion control signal to said Reed-Solomon decoder when the respective coefficient for each of the $X^{(j-1)}$ term of the polynomial is generated after processing of each of the n roots.

32. In a polynomial expander circuit, a method of generating coefficients for a polynomial having a plurality of roots, the method comprising:
providing a plurality of coefficient storage registers;
providing a temporary coefficient register coupled to an output terminal of the coefficient storage registers;
providing a root register;
multiplying a root value stored in the root register with a value stored in the coefficient storage registers to generate a multiplier output;
adding the multiplier output with a value stored in the temporary coefficient register to generate an adder output;
shifting said adder output into the coefficient storage registers; and
shifting, concurrently with the shifting of said adder output into the coefficient storage registers, the value stored in the coefficient storage registers into the temporary register as a next value in the temporary register.

33. In a polynomial expander circuit, a method of generating coefficients for a polynomial having a plurality of roots, the method comprising:
providing a plurality of coefficient storage registers;
providing a temporary coefficient register coupled to an output terminal of the coefficient storage registers;
providing a root register;
multiplying a root value stored in the root register with a value stored in the coefficient storage registers to generate a multiplier output;
adding the multiplier output with a value stored in the temporary coefficient register to generate an adder output;
shifting said adder output into the coefficient storage resisters; and
selecting by a respective multiplexer the input to each coefficient storage register as one of said adder output or the output of a preceding coefficient storage register with said coefficient storage registers coupled in series.

34. The method of claim 33, further comprising:
controlling by a controller said respective multiplexer to select between one of said adder output or the output of said preceding coefficient storage register for each coefficient storage register.

35. The method of claim 33, further comprising:
selecting by said respective multiplexer for each coefficient storage register an initial value during initialization of said polynomial expander.

36. The method of claim 33, further comprising,
selecting by a respective multiplexer the input to said temporary coefficient register as one of an output of the coefficient storage registers or an initial value.

37. In a polynomial expander circuit, a method of generating coefficients for a polynomial having a plurality of roots, the method comprising:
providing a plurality of coefficient storage registers;
providing a temporary coefficient register coupled to an output terminal of the coefficient storage registers;
providing a root register;
multiplying a root value stored in the root resister with a value stored in the coefficient storage registers to generate a multiplier output;
adding the multiplier output with a value stored in the temporary coefficient register to generate an adder output;
shifting said adder output into the coefficient storage registers; and
storing, in a root buffer register, a root value generated by a root source while another root value is being processed through said coefficient storage registers.

38. The method of claim 37, further comprising;
selecting by a root multiplexer the input to said root register as one of an output of said root source or an output of said root buffer register.

39. The method of claim 37, further comprising:
  storing, in a plurality of root buffer registers, a plurality of root values generated by said root source while another root value is being processed through said coefficient storage registers.

40. The method of claim 37, wherein said source of root values is a look-up table.

41. The method of claim 40, wherein the look-up table is coupled to an RS decoder, the look-up table responsive to an address from the decoder to provide an associated root value.

* * * * *

UNITED STATES PATENT AND TRADEMARK OFFICE
CERTIFICATE OF CORRECTION

| | |
|---|---|
| PATENT NO. | : 7,032,162 B1 |
| APPLICATION NO. | : 10/131883 |
| DATED | : April 18, 2006 |
| INVENTOR(S) | : Sudhind Dhamankar |

Page 1 of 1

It is certified that error appears in the above-identified patent and that said Letters Patent is hereby corrected as shown below:

Col. 17, line 43 replace "mot" with -- root --.

Signed and Sealed this

Eighth Day of May, 2007

JON W. DUDAS
*Director of the United States Patent and Trademark Office*